(12) United States Patent  
Marzaki (10) Patent No.: US 12,414,360 B2  
(45) Date of Patent: Sep. 9, 2025

(54) INTEGRATED CIRCUIT INCLUDING AT LEAST ONE CAPACITIVE ELEMENT AND CORRESPONDING MANUFACTURING METHOD

(71) Applicant: STMicroelectronics (Rousset) SAS, Rousset (FR)

(72) Inventor: Abderrezak Marzaki, Aix en Provence (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 571 days.

(21) Appl. No.: 17/723,706

(22) Filed: Apr. 19, 2022

(65) Prior Publication Data

US 2022/0344327 A1    Oct. 27, 2022

(30) Foreign Application Priority Data

Apr. 21, 2021 (FR) .................................. 2104162

(51) Int. Cl.  
*H01L 27/06* (2006.01)  
*H01L 21/762* (2006.01)  
(Continued)

(52) U.S. Cl.  
CPC ..... *H10D 84/811* (2025.01); *H01L 21/76224* (2013.01); *H10B 41/49* (2023.02);  
(Continued)

(58) Field of Classification Search  
CPC .......... H01L 28/40; H01L 28/60; H10D 1/68; H10D 1/692–716; H10D 84/811–813  
(Continued)

(56) References Cited

U.S. PATENT DOCUMENTS 6,372,652 B1 *    4/2002    Verma ................. H01L 23/5256  
                                                        438/719  
2001/0025972 A1 * 10/2001    Moriwaki ........... H01L 27/0629  
                                                        257/296  
(Continued)

FOREIGN PATENT DOCUMENTS

CN        110800098 A       2/2020  
CN        218831251 U       4/2023  
(Continued)

OTHER PUBLICATIONS

Machine translation, Yamashita, Japanese Pat. Pub. No. JP2004253481A, translation date: Jan. 28, 2025, Espacenet, all pages. (Year: 2025).*  
(Continued)

*Primary Examiner* — Victoria K. Hall  
(74) *Attorney, Agent, or Firm* — Crowe & Dunlevy LLC (57) ABSTRACT

A capacitive element includes a first conductive layer delimited by an outline and a low voltage dielectric layer covering the first conductive layer. A second conductive layer covers the low voltage dielectric layer and includes: a first portion located over a central zone of the first conductive layer which forms a first capacitor electrode; and a second portion located over the first conductive layer at the inner border of the entire outline of the first conductive layer, and over the front face at the outer border of the entire outline of the first conductive layer. The first portion and the second portion of the second conductive layer are electrically separated by an annular opening extending through the second conductive layer. The first conductive layer is electrically connected to the second portion of the second conductive layer to form a second capacitor electrode.

22 Claims, 11 Drawing Sheets

(51) Int. Cl.
| | |
|---|---|
| *H01L 21/8234* | (2006.01) |
| *H01L 49/02* | (2006.01) |
| *H10B 41/49* | (2023.01) |
| *H10D 1/68* | (2025.01) |
| *H10D 84/01* | (2025.01) |
| *H10D 84/03* | (2025.01) |
| *H10D 84/80* | (2025.01) |

(52) U.S. Cl.
CPC .............. *H10D 1/68* (2025.01); *H10D 1/692* (2025.01); *H10D 1/696* (2025.01); *H10D 1/711* (2025.01); *H10D 1/714* (2025.01); *H10D 1/716* (2025.01); *H10D 84/0135* (2025.01); *H10D 84/038* (2025.01)

(58) Field of Classification Search
USPC ......................................................... 257/532
See application file for complete search history.

(56) References Cited

U.S. PATENT DOCUMENTS

| | | | | |
|---|---|---|---|---|
| 2004/0079980 | A1* | 4/2004 | Hieda | H10D 1/696 |
| | | | | 257/E27.048 |
| 2006/0284227 | A1* | 12/2006 | Kamiya | H10D 86/85 |
| | | | | 257/296 |
| 2014/0264740 | A1 | 9/2014 | Stribley | |
| 2018/0308635 | A1 | 10/2018 | Chen | |
| 2020/0082989 | A1* | 3/2020 | Kagawa | H10D 1/684 |
| 2020/0411633 | A1* | 12/2020 | Mathur | H01L 28/75 |

FOREIGN PATENT DOCUMENTS

| | | | | | |
|---|---|---|---|---|---|
| JP | 2001144252 | A | * | 5/2001 | ............. H01L 27/04 |
| JP | 2004247520 | A | * | 9/2004 | ........... H01L 21/822 |
| JP | 2004253481 | A | * | 9/2004 | ........... H01L 21/822 |
| JP | 2008252044 | A | * | 10/2008 | ........... H01L 21/822 |

OTHER PUBLICATIONS

Machine translation, Shimomura, Japanese Pat. Pub. No. JP2001144252A translation date: Jan. 28, 2025, Espacenet, all pages. (Year: 2025).*
Machine translation, Yamashita, Japanese Pat. Pub. No. JP2004247520A translation date: Aug. 11, 2024, Espacenet, all pages. (Year: 2024).*
Machine translation, Fujisawa, Japanese Pat. Pub. No. JP2008252044A translation date: Aug. 11, 2024, Espacenet, all pages. (Year: 2024).*
First Office Action, The State Intellectual Property Office of People's Republic of China, Chinese App. No. CN202210420828.7, May 19, 2025, all pages. (Year: 2025).*
First Search, The State Intellectual Property Office of People's Republic of China, Chinese App. No. CN202210420828.7, May 19, 2025, all pages. (Year: 2025).*
INPI Search Report and Written Opinion for priority application, FR Appl. No. 2104162, report dated Dec. 9, 2021, 10 pgs.
CN First Office Action and Search Report for counterpart CN Appl. No. 202210420828.7, report dated May 19, 2025, 7 pgs.

* cited by examiner

INTEGRATED CIRCUIT INCLUDING AT LEAST ONE CAPACITIVE ELEMENT AND CORRESPONDING MANUFACTURING METHOD

PRIORITY CLAIM

This application claims the priority benefit of French Application for Patent No. 2104162, filed on Apr. 21, 2021, the content of which is hereby incorporated by reference in its entirety to the maximum extent allowable by law.

TECHNICAL FIELD

Embodiments and implementations relate to integrated circuits and, in particular, to capacitive elements and the methods for manufacturing capacitive elements in integrated circuits.

BACKGROUND

Some portions of the integrated circuits, such as analog portions and radio frequency (RF) reception chains, have a need for linear capacitive elements in a given power supply voltage range. The power supply voltages in this type of integrated circuit portion are typically in the range of 6V (volts).

The capacitive elements of the Metal-Insulator-Metal (MIM) type, that is to say capacitive elements having two armatures or conductive electrodes separated by a dielectric layer, typically have a good linearity.

However, the capacitive elements of the MIM type can have a relatively low capacitive value per unit area, in particular when these capacitive elements are manufactured in conjunction with other elements of the integrated circuit. Indeed, the joint manufacturing steps are not necessarily dedicated and optimized for the production of capacitive elements.

As a consequence, the capacitive elements of the MIM type can occupy up to 50% of the surface area of the analog and RF receiving portions of the integrated circuit.

Thus, it is desirable to reduce the surface area occupied by the capacitive elements having a good linearity.

Embodiments and implementations in which the thickness of the dielectric layer is reduced in order to increase, in the range of double or even quadruple, the capacitive value per unit area are proposed in this regard.

However, reducing the thickness of the dielectric layer in conventional structures has difficulties insofar as the resulting capacitive elements can undergo electrical degradation during use, chemical degradation during steps of the method for manufacturing the integrated circuit, or else bulky topological constraints.

Figure 1:
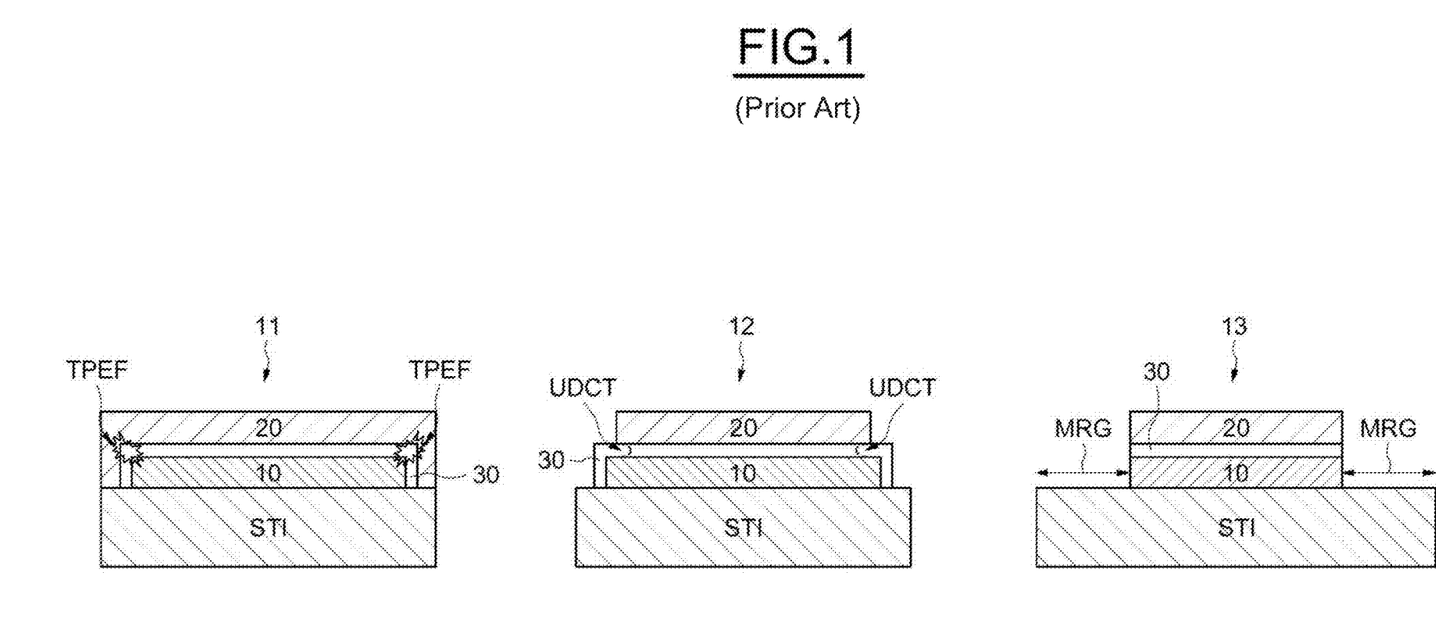
FIG. 1 illustrates sectional views of embodiments of capacitive elements of the MIM type.

Reference is made in this regard to FIG. 1.

FIG. 1 illustrates sectional views 11, 12, 13 of embodiments of capacitive elements of the MIM type, for which it would be desirable to increase the capacitive value per unit area. The capacitive elements are made on a surface of a dielectric region of shallow trench isolation (STI) type, and include a superposition of a first conductive layer 10, a dielectric layer 30 and a second conductive layer 20.

The dielectric layer 30 can be composed of a stack of the "ONO" type, that is to say layers of oxide, nitride and silicon oxide, adapted to withstand high voltages, which typically have a thickness in the range of 13 nm.

In the sectional view 11, the dielectric layer 30 and the second conductive layer 20 include the edges, and in particular the upper ridges, of the first conductive layer 10.

However, by reducing the thickness of the dielectric layer 30, the breakdown voltage of the dielectric layer 30 is also reduced. Consequently, for operating voltages lower than the breakdown voltage, tip effects TPEF along the ridges and at the vertices of the first conductive layer 10 can generate electric fields which can break down the dielectric layer 30.

In the sectional view 12, a portion of the dielectric layer 30 is uncovered on the edges and in particular the ridges of the first conductive layer 10. The dielectric layer 30 does not undergo the risk of breakdown by tip effect, but is exposed during some manufacturing steps.

However, the manufacturing steps can comprise wet etching type treatments, which can dissolve "undercut" UDCT the dielectric layer 30 between the two conductive layers 10, 20, all the more quickly as the dielectric layer 30 is thin. The undercuts UDCT in the dielectric layer 30 can cause reliability problems such as premature breakdowns.

In the sectional view 13, the first conductive layer 10, the second conductive layer 20, and the dielectric layer 30 are self-aligned, that is to say having plumb-aligned edges, typically by a common directional etching. This allows avoiding a priori both the problem of breakdown by tip effect and undercut. However, in practice this type of etching of a high topology superposition is not provided in the analog portion and in the RF reception portion, these portions typically having a low topology. This requires providing an empty margin MRG around the capacitive element, in the range of a few micrometers, due to the constraints of transitions between zones of different topologies.

The space occupied by the empty margin MRG reduces, in practice, the capacitive value per unit area of such an embodiment. In small embodiments of capacitive elements, this can even generate a loss relative to a conventional embodiment, despite the gain obtained by reducing the thickness of the dielectric layer 30.

Consequently, there is a need to increase the capacitive value per unit area of the capacitive elements, in particular the voltage linear capacitive elements, while avoiding the risks of degradation in use and during the manufacture of the integrated circuit, which are mentioned above. At the same time, it is desirable that the manufacture of the capacitive element can be cointegrated with other typical embodiments of the integrated circuit.

SUMMARY

According to one aspect, in this regard, an integrated circuit is proposed, including at least one capacitive element comprising: a first conductive layer disposed on a front face of a semiconductor substrate, delimited by an outline, and forming a first electrode of the capacitive element; a low voltage dielectric layer covering the first conductive layer; and a second conductive layer. This second conductive layer includes: a first portion located on a central zone of the first conductive layer and forming a second electrode of the capacitive element; a second portion located, on the one hand, on an upper surface of the first conductive layer, on an inner border of the entire outline of the first conductive layer, and on the other hand, on the front face, on an outer border of the entire outline of the first conductive layer; wherein the first portion and the second portion of the second conductive layer are electrically separated, the first conductive layer being adapted to be electrically connected to the second portion of the second conductive layer.

The term "low voltage" dielectric layer means a dielectric layer having a breakdown voltage at the limit of the low voltage domain of the integrated circuit. The term "low voltage" is thus defined in a relative manner with respect to the voltages involved in a given embodiment of an integrated circuit. Generally, low voltages can be voltages in the range of 1V to 2V, or more broadly, voltages below 5V.

The low voltage dielectric layer can allow doubling, or even quadrupling, the capacitive value per unit area, relative to a conventional dielectric layer of the "ONO" type.

The term "high voltage", used hereinafter, also has a relative meaning with respect to the voltages involved in a given embodiment of an integrated circuit. A high voltage dielectric layer corresponds to a dielectric layer capable of withstanding the high voltage domain of the integrated circuit. Generally, the high voltages can be voltages in the range of 12V, or more broadly voltages comprised between 5V and 20V.

On the one hand, the capacitive element defined according to this aspect does not have the risk of breakdown of the dielectric layer caused by a tip effect, given that the ridges and the vertices of the first conductive layer, located over the entire outline thereof, are covered by the second portion of the second conductive layer, and without having a potential difference with the first conductive layer.

On the other hand, the outer delimitation of the second conductive layer, made in a single thickness of the second conductive layer resting on the front face, does not impose any particular topological constraint.

On the other hand also, the structure thus defined of the capacitive element can be made such that the low voltage dielectric layer is completely covered, and therefore protected, during wet etching steps, until forming the electrical separation between the first and second portions of the second conductive layer.

According to one embodiment, an annular opening is disposed through the entire thickness of the second conductive layer until reaching the first conductive layer, in order to separate the first portion of the second conductive layer inside the annular shape of the opening and the second portion of the second conductive layer outside the annular shape of the opening.

Again, the formation of the annular opening, made in a single thickness of the second conductive layer resting on the first conductive layer, does not impose any particular topological constraint, nor any subsequent wet etching.

According to one embodiment, the first conductive layer is disposed on an isolation region in the semiconductor substrate, of the shallow trench isolation type.

This corresponds to an embodiment of a capacitive element of the MIM type, exhibiting a capacitive value having good voltage linearity. The term "good linearity" means a capacitive value having acceptable variations for an application, for example in radiofrequency reception or in an analog circuit, in the range of operating voltages of said application.

It will be noted that the acronym MIM, although derived from the terms "Metal-Insulator-Metal", more generally designates structures of conductive materials other than metal, such as polycrystalline silicon, and is distinguished in particular from capacitive elements of the MOS type, acronym for the "Metal-Oxide-Semiconductor" structures well known to a person skilled in the art, which are generally less linear.

According to one embodiment, the low voltage dielectric layer is a silicon oxide layer having a thickness comprised between 1 nanometer and 6 nanometers.

According to one embodiment, the low voltage dielectric layer has the same composition and the same thickness as a gate dielectric layer of a low voltage transistor of the integrated circuit intended to operate at low voltages below 5V.

This embodiment reflects a cointegrated manufacturing of the low voltage dielectric layer with a step of manufacturing a low voltage transistor of the integrated circuit.

According to one embodiment, the second conductive layer has the same composition and the same thickness as a gate conductive region of a low voltage transistor of the integrated circuit intended to operate at low voltages below 5V.

This embodiment reflects a cointegrated manufacture of the second conductive layer with a step of manufacturing a low voltage transistor of the integrated circuit. Moreover, this cointegration reflects that the low voltage dielectric layer can be covered by the second conductive layer during all steps of the manufacturing process until defining the gate regions of the low voltage transistors.

According to one embodiment, the first conductive layer has the same composition and the same thickness as a gate conductive region of a high voltage transistor of the integrated circuit intended to operate at high voltages greater than 5V.

This embodiment reflects a cointegrated manufacture of the first conductive layer with a step of manufacturing a high voltage transistor of the integrated circuit.

According to another aspect, a method is proposed for manufacturing an integrated circuit including at least one capacitive element, the manufacture of the capacitive element comprising: forming a first electrode of the capacitive element comprising depositing a first conductive layer on a front face of a semiconductor substrate, and etching to define an outline of the first conductive layer; forming a low voltage dielectric layer covering the first conductive layer; depositing a second conductive layer on the front face and on the first conductive layer covered by the low voltage dielectric layer; first etching to define the second conductive layer so as to cover the first conductive layer and the front face on the border of the entire outline of the first conductive layer; second etching to electrical separate a first portion and a second portion of the second conductive layer, the first portion of the second conductive layer being located on a central zone of the first conductive layer and forming a second electrode of the capacitive element, the second portion of the second conductive layer being located, on the one hand, on an upper surface of the first conductive layer, on an inner border of the entire outline of the first conductive layer, and on the other hand, on the front face, on an outer border of the entire outline of the first conductive layer; and forming an electrical connection between the first conductive layer and the second portion of the second conductive layer.

According to one implementation, the second etching is positioned so as to etch an annular opening through the entire thickness of the second conductive layer until reaching the first conductive layer, separating the first portion of the second conductive layer inside the annular shape of the opening and the second portion of the second conductive layer outside the annular shape of the opening.

According to one implementation, the method comprises, prior to forming the first electrode, forming an isolation region in the semiconductor substrate, of the shallow trench isolation type, the first electrode being formed on the isolation region.

According to one implementation, the low voltage dielectric layer is formed by a silicon oxide layer having a thickness comprised between 1 nanometer and 6 nanometers.

According to one implementation, the manufacture of the integrated circuit further comprises manufacturing a low voltage transistor intended to operate at low voltages below 5V, and wherein forming the low voltage dielectric layer is made at the same time as forming a gate dielectric layer of the low voltage transistor.

According to one implementation, the manufacture of the integrated circuit further comprises manufacturing a low voltage transistor intended to operate at low voltages below 5V, and wherein depositing the second conductive layer is made at the same time as depositing a gate conductive layer of the low voltage transistor, and wherein the second etching of the second conductive layer is made at the same time as etching the gate conductive layer defining the gate region of the low voltage transistor.

According to one implementation, the manufacture of the integrated circuit further comprises manufacturing a high voltage transistor intended to operate at high voltages greater than 5V, and wherein forming the first electrode is made at the same time as forming a gate region of the high voltage transistor.

BRIEF DESCRIPTION OF THE DRAWINGS

Other advantages and features of the invention will appear on examining the detailed description of embodiments and implementations, which are in no way limiting, and the appended drawings, in which:

FIGS. 4A to 4I illustrate steps and results of steps of a method for manufacturing the capacitive element CPP shown in FIGS. 2 and 3.

DETAILED DESCRIPTION

Figure 2:
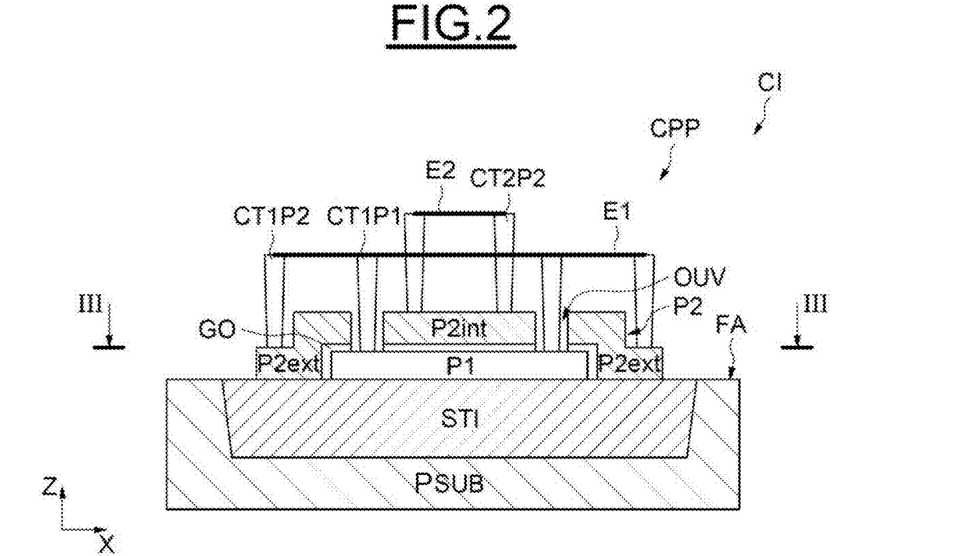
FIGS. 2 and 3 illustrate an embodiment of a capacitive element.
Figure 3:
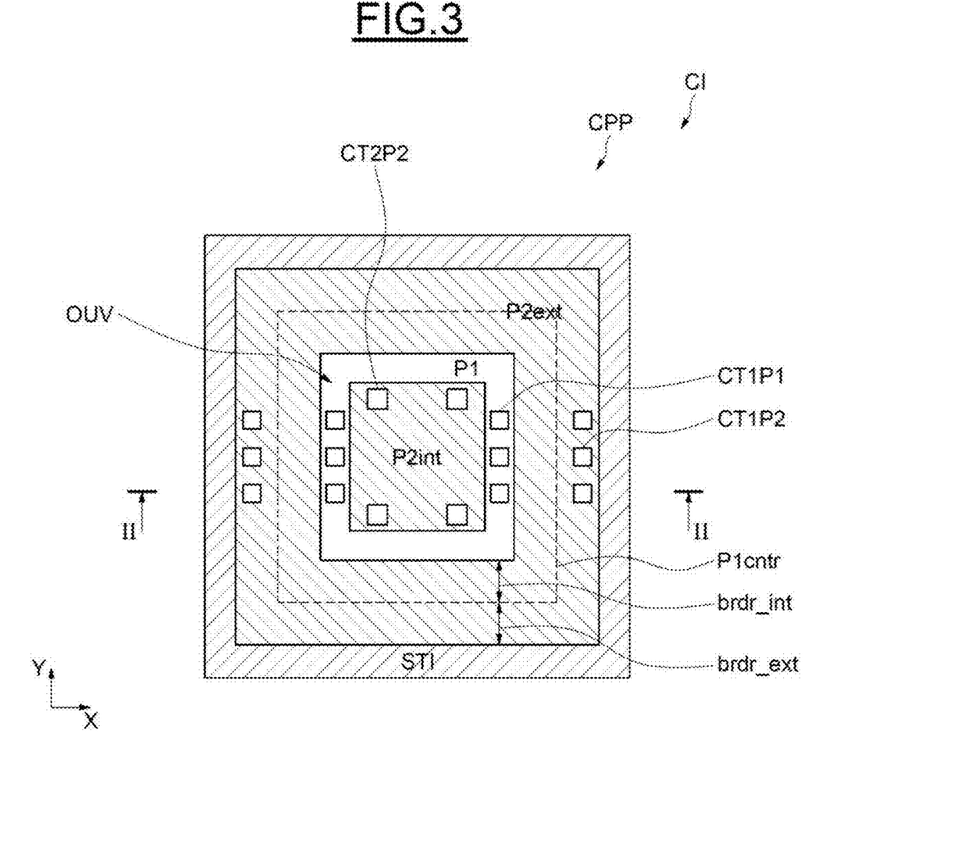

FIGS. 2 and 3 illustrate an advantageous exemplary embodiment of a capacitive element CPP of an integrated circuit CI.

The capacitive element CPP may for example belong to a radiofrequency (RF) communication circuit of the integrated circuit CI, for example in a filtering circuit of an RF reception chain; or in an analog portion of the integrated circuit CI, for example in a compensation circuit or as a decoupling capacitor.

FIG. 2 illustrates a sectional view of the capacitive element CPP, in an xz plane of a reference mark (xyz), substantially at the position II-II of FIG. 3.

FIG. 3 illustrates a top view of the capacitive element CPP, in a xy plane of the reference mark (xyz), substantially at the position of FIG. 2.

The capacitive element CPP comprises a superposition of a first conductive armature P1 of a first electrode E1, of a dielectric interface GO, and of a second conductive armature P2int of a second electrode E2.

It is considered that an electrode includes the corresponding conductive armature and an electrode terminal, formed for example in metal levels of an interconnection portion of the integrated circuit, provided for coupling the capacitive element with the circuit to which it is intended.

This superposition is disposed in the order given above, starting on a front face FA of a semiconductor substrate PSUB of the integrated circuit CI. The surface of the front face FA, on which the capacitive element CPP is disposed, is fully included in the upper surface, in the plane of the front face FA, of an isolation region STI of the shallow trench isolation type.

The shallow trench isolations are typical elements allowing laterally isolating wells or active regions of the substrate PSUB. The shallow trench isolations STI are conventionally formed by etching openings called trenches in the substrate PSUB, a filling of the trenches with a dielectric material, typically silicon oxide, and by polishing the excess dielectric until uncovering the front face FA.

Thus, the capacitive element CPP is an MIM type realization (for "Metal-Oxide-Metal" generalized by extension to conductor-insulator-conductor structures), thus having a good linearity of the capacitive value relative to the applied voltage. Furthermore, the MIM-type capacitive element CPP does not have in particular a connection with the semiconductor substrate PSUB, which may broadcast interfering signals or require bulky insulation semiconductor structures of the triple-well type.

The first armature includes a first conductive layer P1 made of polycrystalline silicon, thus disposed on the isolation region STI at the front face FA.

The first conductive layer P1 is delimited by the outline thereof P1cntr, rectangular in shape in FIG. 3, but may have another shape allowing occupying an available surface in the integrated circuit, sometimes called a "filling capacitor" in this regard.

For example, the first conductive layer P1 may have the same composition and the same thickness as a gate conductive region HVG (FIG. 4I) of a high or medium voltage transistor MOS HV-MV (FIG. 4I) of the integrated circuit intended for operate at high or medium voltages greater than 5V.

The first conductive layer P1 can also have the same composition and the same thickness as a floating gate conductive region of a floating gate transistor of a memory cell NVMcell (FIG. 4I) of the integrated circuit.

The dielectric interface includes a low voltage dielectric layer GO covering the first conductive layer P1.

The term "low voltage" dielectric layer means a dielectric layer having a breakdown voltage adapted to a low voltage domain of the integrated circuit, but not to a high voltage domain.

The terms "low voltage" and "high voltage" are thus defined in a relative manner with respect to the voltages involved in the integrated circuit. For example, the low voltages can be voltages in the range of 1V to 2V, or more broadly, voltages below 5V with a tolerance margin, while the high voltages can be voltages in the range of 12V, or more broadly voltages comprised between 5V and 20V.

For example, the low voltage dielectric layer GO is a silicon oxide layer having a thickness comprised between 1 nanometers and 6 nanometers.

Also, the low voltage dielectric layer GO can advantageously have the same composition and the same thickness as a gate dielectric layer GO of a low voltage transistor MOS LV (FIG. 4I) of the integrated circuit intended to operate at low voltages below 5V.

In fact, one can differentiate two types of low voltage transistor, having respective gate dielectric layers of different thicknesses.

For example, a first low voltage dielectric thickness "GO1", for example in the range of 2 nm, corresponds in particular to logic circuit transistors intended to operate at voltages below 1.5V.

For example, a second low voltage dielectric thickness "GO2", for example in the range of 5 nm, corresponds in particular to input/output interface circuit transistors intended to operate at voltages comprised between 2V and 5V.

Finally, the second armature includes a first portion P2int of a second conductive layer P2 made of polycrystalline silicon, disposed on the dielectric layer GO, and positioned in a central zone of the first conductive layer P1.

The term "central zone" means a surface located inside the shape delimited by the outline P1cntr of the first conductive layer P1. For example, the central zone can be delimited according to the shape of a homothetic reduction in the shape of the outline P1cntr of the first conductive layer P1.

For example, the second conductive layer P2 may have the same composition and the same thickness as a conductive region of the gate of the low voltage transistor MOS LV (FIG. 4I) of the integrated circuit.

The second conductive layer P2 can also have the same composition and thickness as a control gate conductive region of a floating gate transistor of a memory cell NVMcell (FIG. 4I) of the integrated circuit.

Furthermore, a second portion P2ext of the same second conductive layer P2 is disposed over the entire outline P1cntr of the first conductive layer P1.

Indeed, the second portion P2ext of the second conductive layer P2 is located, on the one hand, on the upper surface of the first conductive layer P1, on the inner border brdr_int of the entire outline of the first conductive layer P1cntr, and on the other hand, on the front face FA, on the outer border brdr_ext of the entire outline of the first conductive layer P1cntr.

The second portion P2ext of the second conductive layer P2 thus surrounds the first conductive layer P1, in the form of a staircase, thus encompassing the ridges and the vertices located over the entire contour P1cntr of the first conductive layer P1.

The first conductive layer P1 and the second portion of the second conductive layer P2ext are electrically connected, so as to have a potential difference which is always zero therebetween.

For example, contact pillars CT1P1 can link the first conductive layer P1 to a terminal of the first electrode E1, and contact pillars CT1P2 can link the second portion P2ext of the second conductive layer P2 to the terminal of the first electrode E1, in order to connect the first conductive layer P1 with the second portion P2ext.

Similarly, the first portion P2int of the second conductive layer P2 can be electrically connected to a terminal of the second electrode E2 by contact pillars CT2P2.

An annular opening OUV is formed through the entire thickness of the second conductive layer P2 until reaching the first conductive layer P1, on the one hand, in order to electrically separate the first portion P2int and the second portion P2ext of the second conductive layer P2.

Thus, the first portion of the second conductive layer P2int is located inside the ring shape of the opening OUV and the second portion of the second conductive layer P2ext is located outside the ring shape of the opening OUV.

The ring shape of the opening OUV is a rectangular ring in the representation of FIG. 3. The terms "ring" and "annular" designate a geometrical area delimited by an inner perimeter and an outer perimeter which are parallel to each other, and parallel to the outline of the first conductive layer P1cntr. In other words, the annular opening can be materialized by a strip running along the outline P1cntr at a distance offset inwardly, the offset corresponding to said inner border brdr_int.

On the other hand, the opening formed in the second conductive layer P2 gives access to the first conductive layer P1, in particular to connect the contact pillars CT1P1 thereto.

Finally, the structure of the capacitive element CPP can be made such that the low voltage dielectric layer GO is completely covered until the formation of said annular opening OUV. The low voltage dielectric layer GO is therefore protected during wet etching steps. Reference is made in this regard to FIGS. 4A to 4I.

FIGS. 4A to 4I illustrate steps and results of steps of an example of a method for manufacturing the capacitive element CPP (GO) of an integrated circuit CI, as previously described in relation to FIGS. 2 and 3.

In addition to the manufacture of the capacitive element CPP (GO), FIGS. 4A to 4I illustrate steps of manufacturing other elements of the integrated circuit, which are implemented in conjunction with the steps of manufacturing the capacitive element CPP.

In this example, the other elements of the integrated circuit CI include non-volatile memory cells NVMcell, a high voltage capacitive element CP1P2 (ONO), high and medium voltage transistors MOS HV-MV and low voltage transistors MOS LV.

For brevity, reference will be made to the high and medium voltage transistors as "high voltage transistors".

The manufacture of the capacitive element CPP can be cointegrated with the manufacture of only some of the other integrated circuit elements which are exemplified herein.

In particular, the presence of the high voltage capacitive element CP1P2 (ONO) is not necessary for the cointegration, and for example, the presence of the memory cells NVMcell and the low voltage transistors MOS LV as well as the high and medium voltage transistors MOV HV-MV may be sufficient for a complete cointegration of the manufacture of the capacitive element CPP (GO).

Figure 4A:
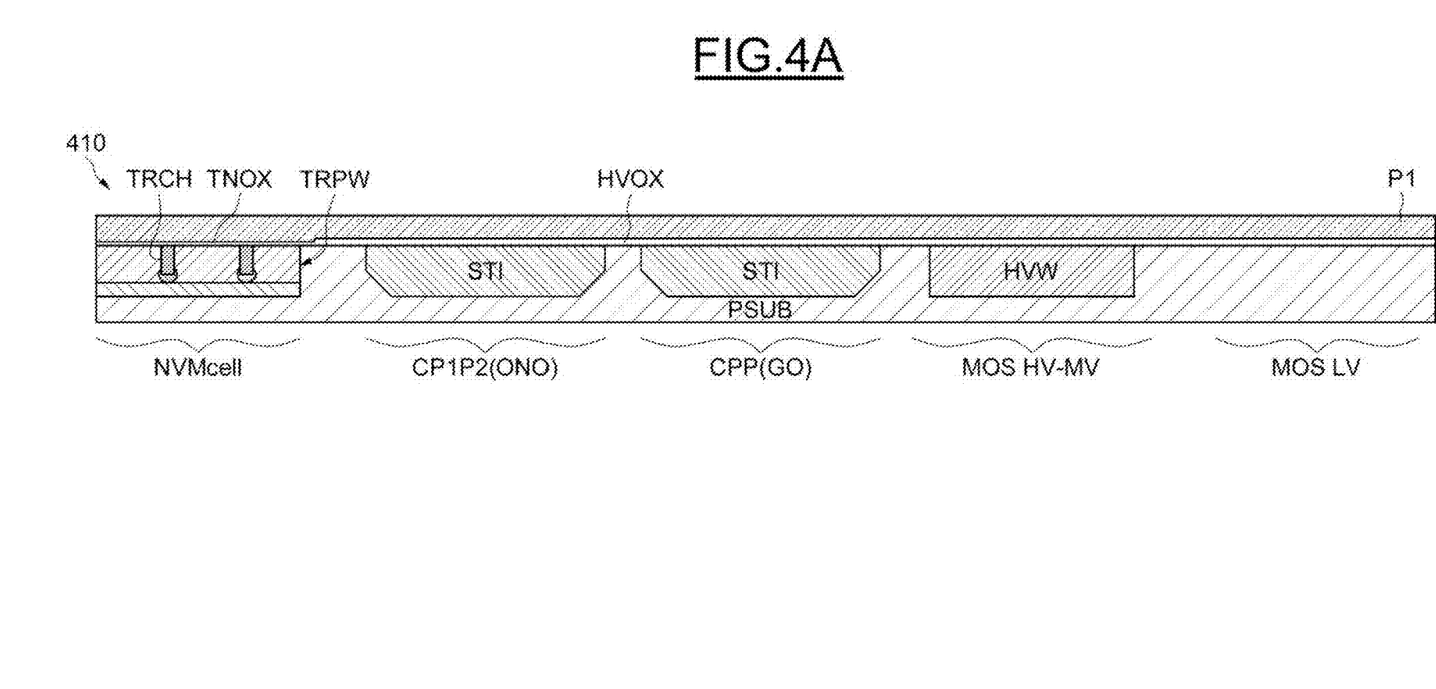

FIG. 4A illustrates the result 410 of forming shallow isolation regions STI, particularly in the regions accommodating the capacitive elements CPP (GO) and CP1P2 (ONO) to avoid forming a capacitive interface with the semiconductor substrate PSUB, but also in the other regions to form typical lateral isolation regions.

Further, an implantation of a triple well TRPW has been performed in the region of the memory cell NVMcell and an implantation of a high voltage well HVW has been performed in the region of the high voltage transistors MOS HV-MV.

Vertical gate regions TRCH of buried access transistors have been formed in open trenches in the triple well TRPW of the region of the memory cells NVMcell.

A high voltage dielectric layer HVOX has been formed, for example by thermal growth, over the entire front face FA of the substrate PSUB except in the portion of the memory cells NVMcell where the thickness of the dielectric has been reduced to a thickness called tunnel TNOX associated with the tunnel oxide layer of the memory cell transistor.

Finally, a first conductive layer P1, for example made of polycrystalline silicon, has been deposited on all regions of the integrated circuit.

The first conductive layer P1 will form floating gates in the portion of the memory cells NVMcell, first armatures of the capacitive elements CPP (GO), CP1P2 (ONO), and gates of the high voltage transistors MOS HV-MV.

Figure 4B:
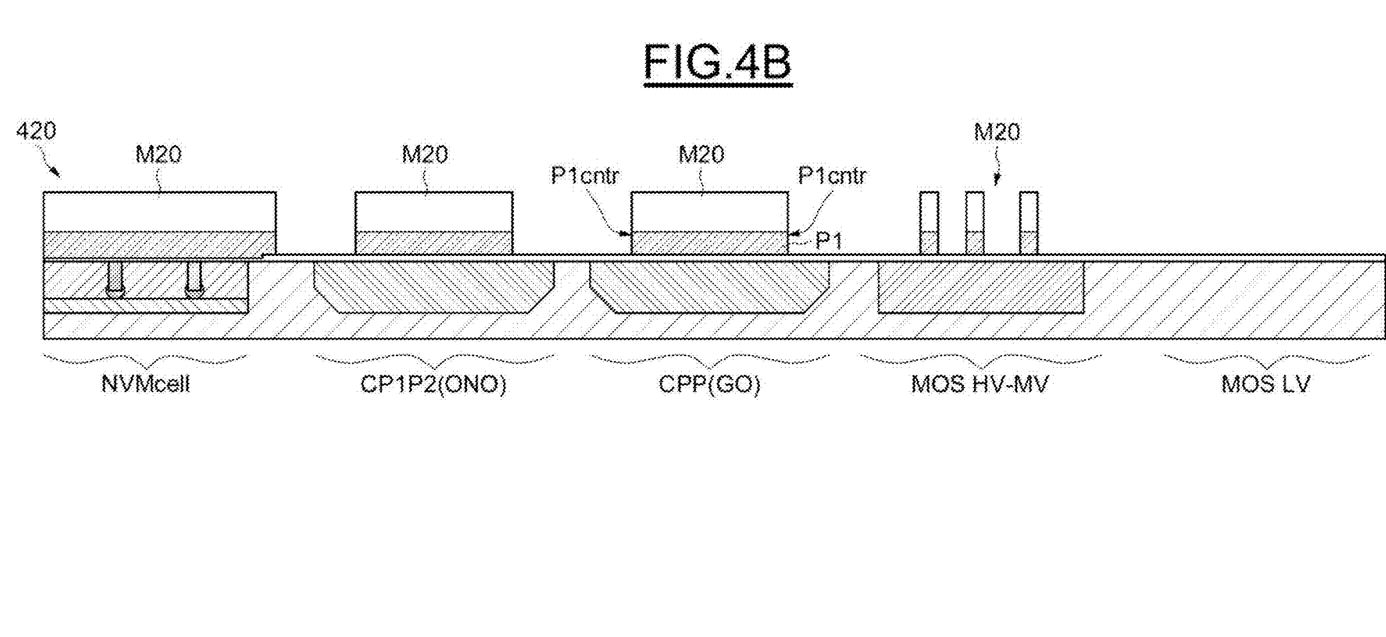

FIG. 4B illustrates an etching 420 of the first conductive layer P1, allowing removing the first conductive layer P1 from the region of the low voltage transistors MOS LV, and defining the position and the shape of the gate structures of the high voltage transistors MOS HV-MV, as well as a first armature of the high voltage capacitive element CP1P2 (ONO).

The etching 420 also allows defining the outline P1cntr of the first frame of the capacitive element CPP (GO).

The etching 420 uses a photolithographed mask M20 defining the zones which are exposed or not to a directional etching, typically a plasma-type dry etching.

Figure 4C:
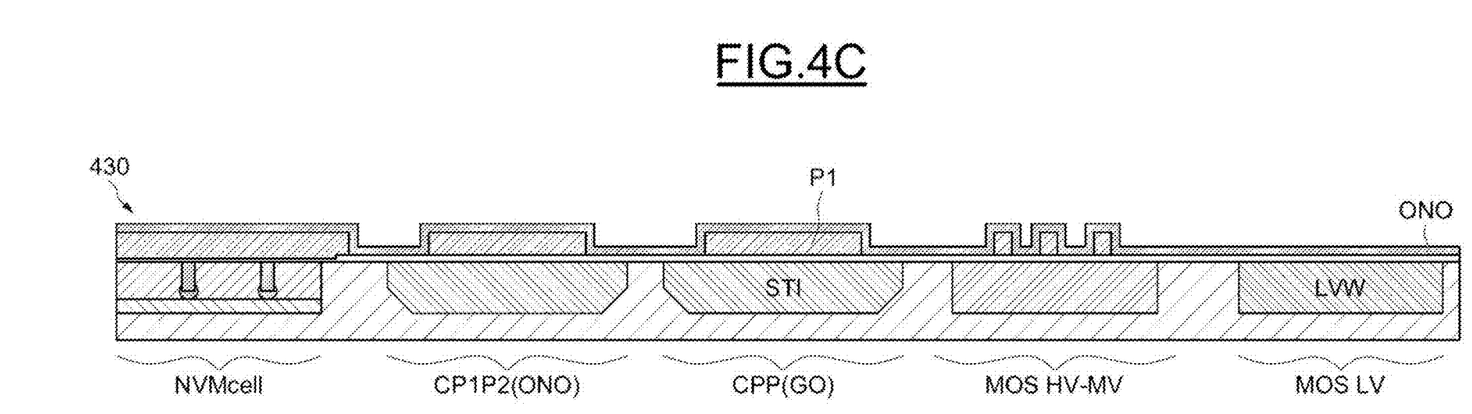

FIG. 4C illustrates the result 430 of implanting a low voltage well LVW in the portion of the low voltage transistors LV MOS and forming of a dielectric layer ONO. The dielectric layer ONO typically includes a superposition of oxide, nitride, and silicon oxide layers formed over all regions of the integrated circuit. The formation of the dielectric layer ONO is isotropic, that is to say that the growth of the layer is of a thickness which is substantially equal regardless of the orientation of the surface on which the growth is made.

The dielectric layer ONO allows in particular forming a dielectric thickness having a breakdown voltage greater than high voltages involved in the operation of the integrated circuit CI, in particular in the region of the memory cells NVMcell and the region of the high voltage capacitive element CP1P2 (ONO). Furthermore, the dielectric layer ONO allows constituting a stop layer for etchings of the second conductive layer P2 (see FIG. 4G).

Figure 4D:
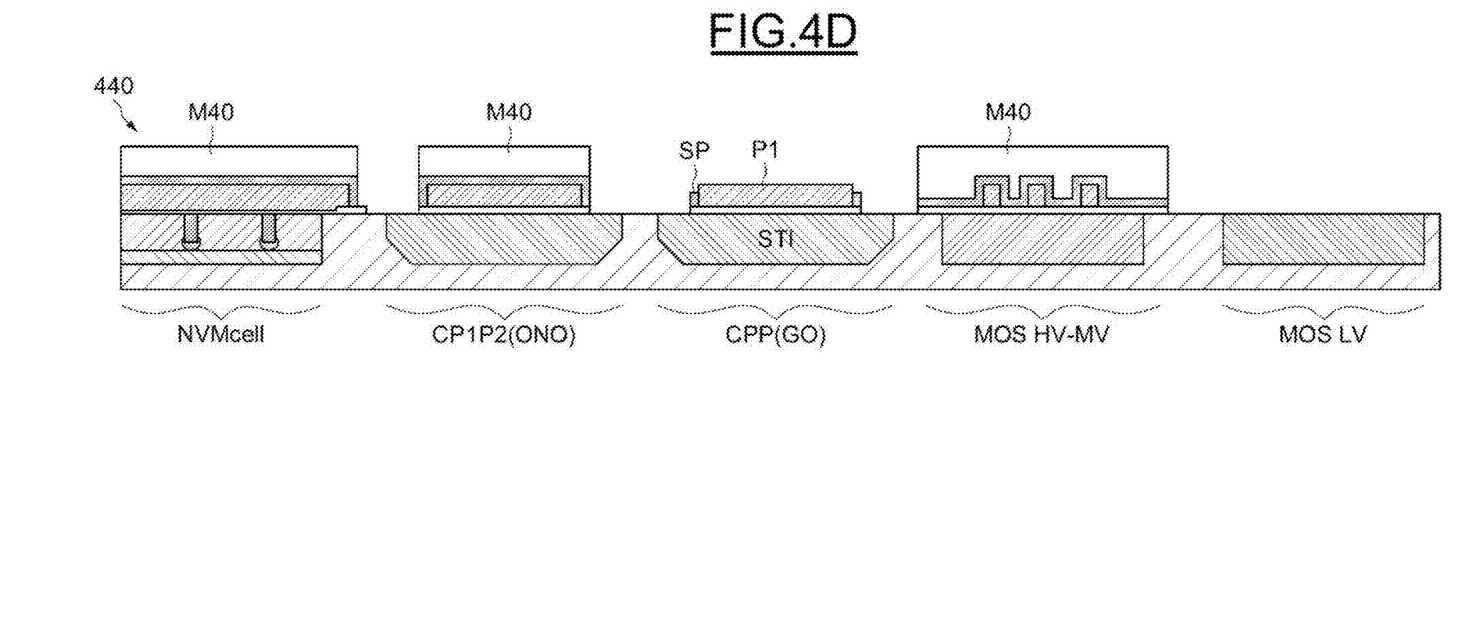

FIG. 4D illustrates a step of removing 440 of the dielectric layer ONO, in particular in the region of the low voltage transistors MOS LV and in the region of the capacitive element CPP (GO). The removal step 440 uses a photolithographed mask M40, defining the zones which are exposed or not to a directional etching.

The etching being typically provided to remove a flat dielectric thickness ONO, a remainder of a vertical overthickness (in the direction of the etching) may be present on the flanks of the first armature P1 of the capacitive element CPP (GO) forming a spacer SP in a manner comparable to gate spacers.

Figure 4E:
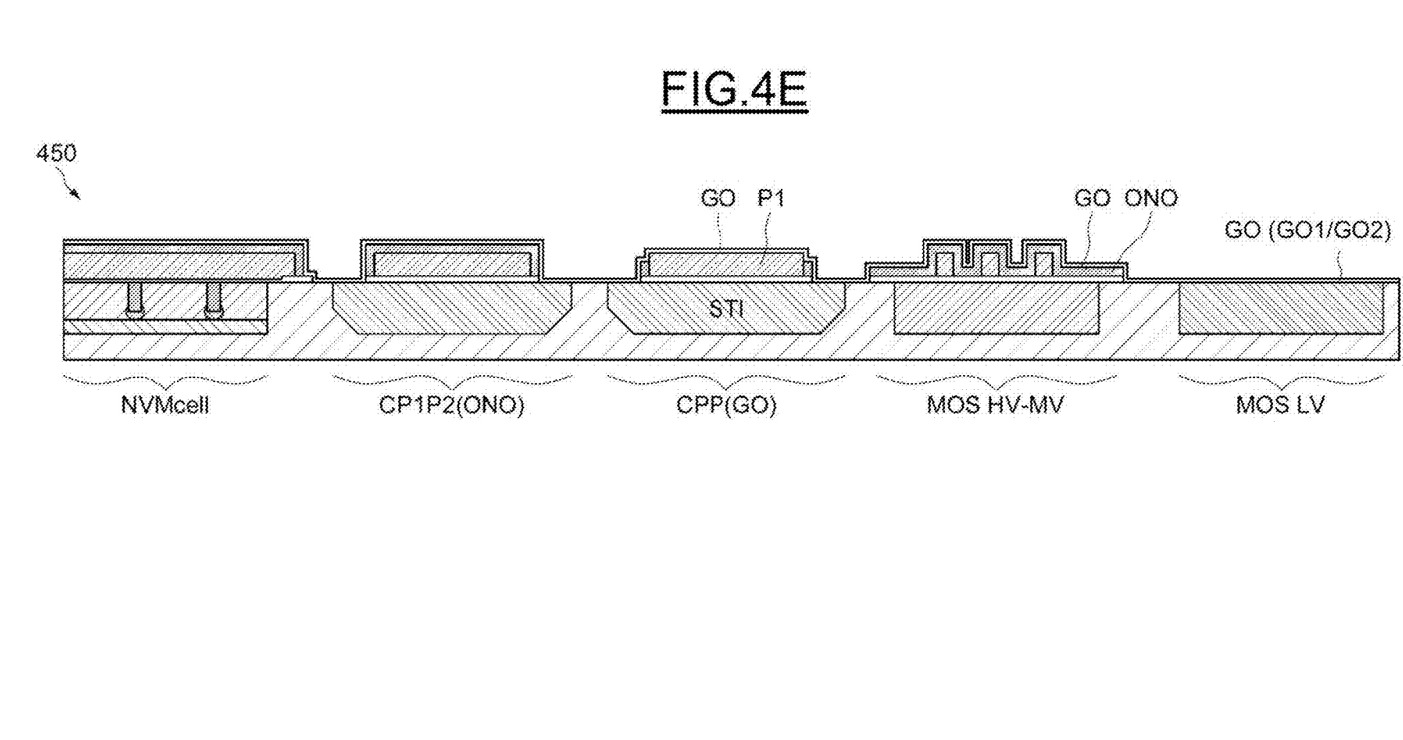

FIG. 4E illustrates a formation 450 of a low voltage dielectric layer GO over all regions of the integrated circuit.

The formation 450 of the low voltage dielectric layer GO is also isotropic and covers in particular the entire first armature P1 of the capacitive element CPP (GO).

The low voltage dielectric layer GO is intended in particular to form gate dielectrics of the low voltage transistors MOS LV.

In this regard, depending on the type of formed transistor and the voltage domain for which they are intended, the low voltage dielectric layer GO may have a first thickness GO1, for example comprised between 1 nm and 3 nm, for voltages below 1.5V. An additional dielectric layer GO2 can be formed over the layer GO1, to form a greater cumulative thickness, for example comprised between 3 nm and 6 nm, for voltages below 5V.

Figure 4F:
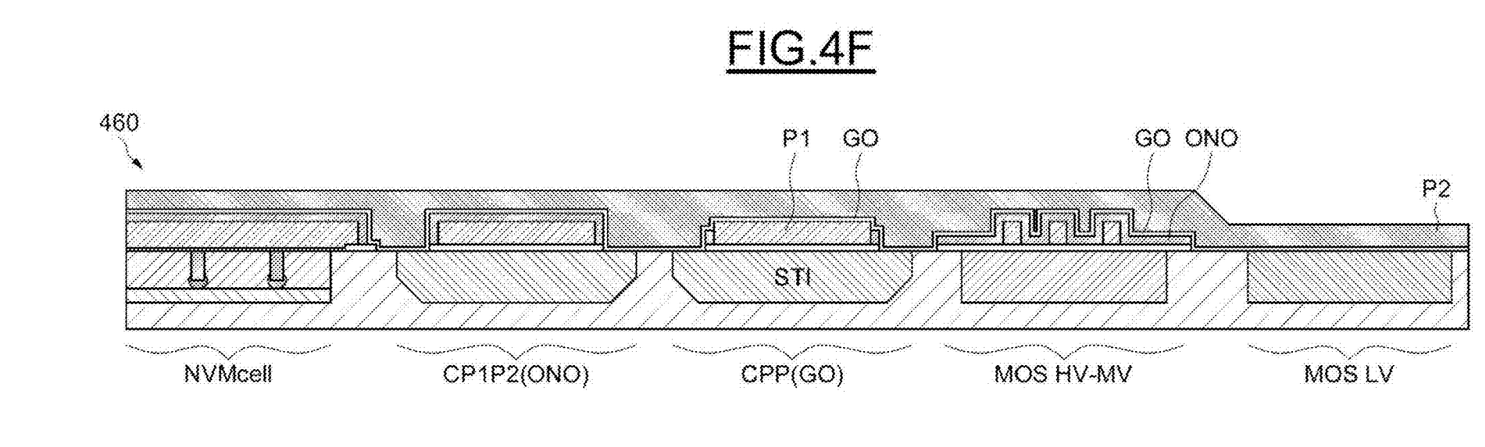

FIG. 4F illustrates a formation 460 of a second conductive layer P2, for example made of polycrystalline silicon, deposited on all regions of the integrated circuit.

The second conductive layer P2 will form control gates in the portion of the memory cells NVMcell, second armatures of the capacitive elements CPP (GO), CP1P2 (ONO), and gates of the low voltage transistors MOS LV.

Figure 4G:
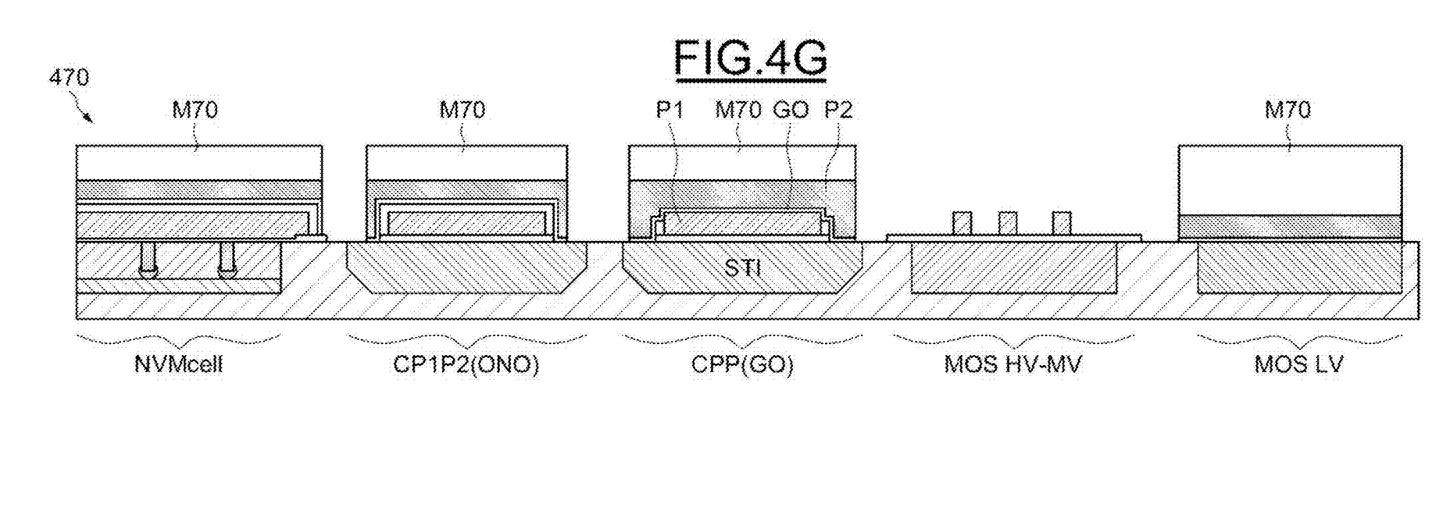

FIG. 4G illustrates a first etching 470 of the second conductive layer P2, allowing removing the second conductive layer P2 from the region of the high voltage transistors MOS HV-MV, and defining the extent of a second armature of the high voltage capacitive element CP1P2 (ONO).

The high voltage capacitive element CP1P2 (ONO) thus formed may correspond to the conventional example 11 of FIG. 1.

The first etching 470 of the second conductive layer P2 further allows defining the extent of the second conductive layer P2 in the region of the capacitive element CPP (GO), so as to completely cover the first conductive layer P1 and to overflow on the front face FA on the border brdr_ext (FIG. 3) of the entire outline of the first conductive layer P1cntr (FIG. 3).

The first etching 470 of the second conductive layer P2 again uses a photolithographed mask M70 defining the zones which are exposed or not to a directional etching, typically a dry etching of the plasma type.

Furthermore, the first etching 470 of the second conductive layer P2 is adapted to be selectively stopped by the dielectric layer ONO, in the portion of the high voltage transistors MOS HV-MV. During the etching 470, the dielectric layer ONO is located between the second conductive layer P2 and the gates of the high voltage transistors MOS HV-MV defined in the first conductive layer P1.

After the dry etching, a remainder of the dielectric layer ONO is typically present in the region of the high voltage transistors MOS HV-MV, and the remainder is removed by isotropic wet etching, typically by an acid bath of an adapted composition.

During wet etching, the low voltage dielectric layer GO is entirely covered in the region of the low voltage transistors MOS LV and in the region of the capacitive element CPP (GO).

Figure 4H:
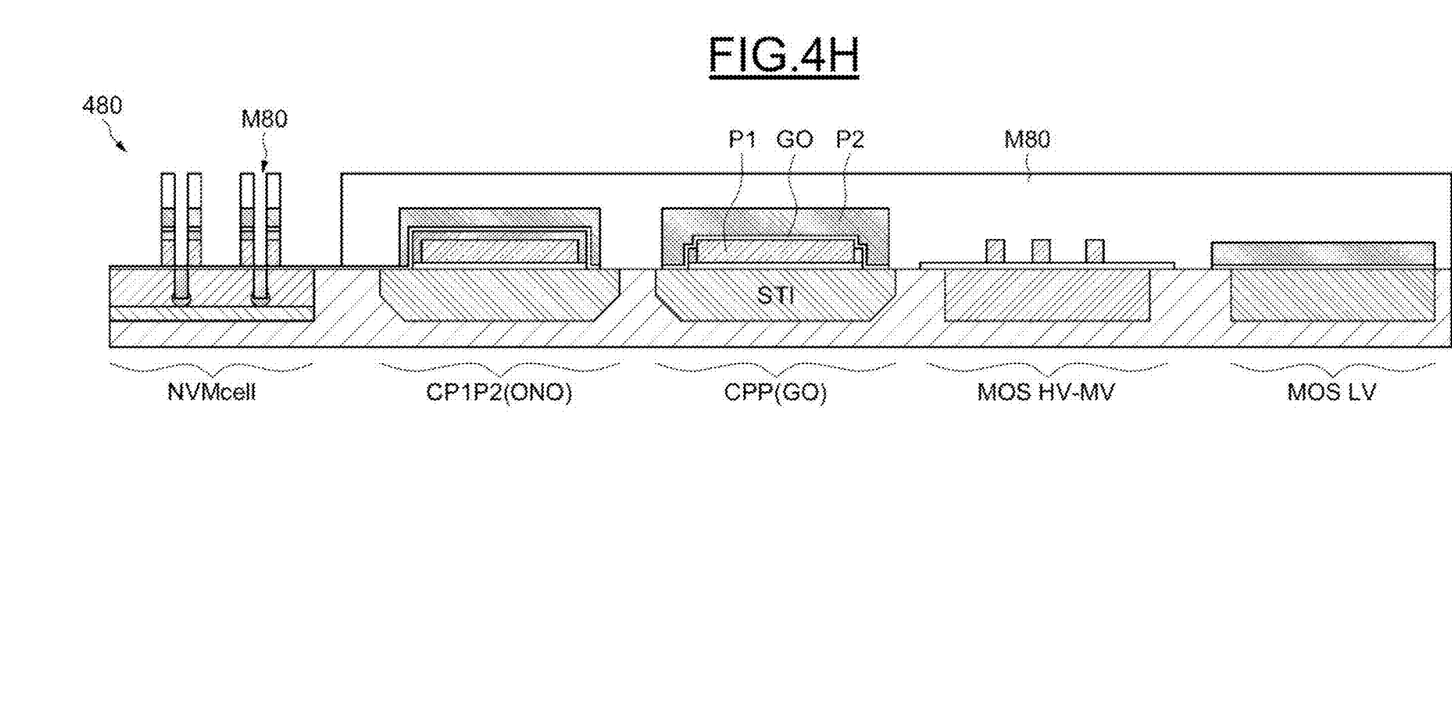

FIG. 4H illustrates an etching step 480 adapted for high topologies allowing defining in a self-aligned manner floating gate and control gate stacks in the region of the memory cells NVMcell. A photolithographed mask M80 positions the stacks of the gate regions.

The other regions CP1P2, CPP, MOS HV-MV, MOS LV of the integrated circuit, which are in particular not adapted for a high-topology etching 480, are entirely covered by the mask M80.

FIG. 4I illustrates a second etching 490 of the second conductive layer P2, allowing defining the position and the shape of the gate structures of the low voltage transistors MOS LV.

Furthermore, the second etching 490 of the second conductive layer P2 allows forming an opening in the entire thickness of the second conductive layer P2 until reaching the first conductive layer P1, in the region of the capacitive element CPP (GO).

Again, the second etching 490 uses a photolithographed mask M90, defining the zones which are exposed or not to a directional etching.

The opening is formed to electrically separate a first portion P2int and a second portion P2ext of the second conductive layer P2. The first portion P2int is located on a central zone of the first conductive layer P1 so as to form a second armature, or electrode, of the capacitive element CPP. The second portion P2ext is located, on the one hand, on the first conductive layer P1 on the border of the entire outline of the first conductive layer brdr_int (FIG. 3), and on the other hand, on the front face FA on the border of the entire outline of the first conductive layer brdr_ext (FIG. 3).

Finally, a conventional formation (not represented) of contact pillars can be implemented in the different regions of the integrated circuit to connect the elements thus obtained to an interconnection network.

In particular, first metal contacts CT1P1 placed in the opening allow connecting the first armature P1 to a first electrode terminal of the capacitive element CPP (GO), and second metal contacts CT1P2 allow connecting the second portion P2ext of the second conductive layer P2 to the first terminal of the capacitive element CPP (GO), so as to obtain the previously described structure in relation to FIGS. 2 and 3.

The invention claimed is:

1. An integrated circuit including a capacitive element, comprising:
   a first conductive layer disposed on a front face of a substrate, delimited by an outline, and forming a first part of a first electrode of the capacitive element;
   a low voltage dielectric layer covering the first conductive layer;
   a second conductive layer on the low voltage dielectric layer and including:
      a first portion located over an upper surface of the first conductive layer at a central zone of the first conductive layer and forming a second electrode of the capacitive element;
      a second portion comprising an inner border part located over the upper surface of the first conductive layer and surrounding the first portion and an outer border part located over the front face of the substrate and surrounding the first conductive layer;
      the second portion forming a second part of the first electrode of the capacitive element;
      wherein the first portion and the second portion of the second conductive layer are electrically separated; and
      wherein the first conductive layer is electrically connected to the second portion of the second conductive layer.

2. The integrated circuit according to claim 1, wherein an annular opening is disposed through the entire thickness of the second conductive layer until reaching the first conductive layer, said annular opening separating the first portion of the second conductive layer, located inside the shape of the annular opening, from the inner border part of the second portion of the second conductive layer, located outside the shape of the annular opening.

3. The integrated circuit according to claim 1, wherein the first conductive layer is disposed on an isolation region of the substrate of a shallow trench isolation type.

4. The integrated circuit according to claim 1, wherein the low voltage dielectric layer is a silicon oxide layer having a thickness comprised between 1 nanometer and 6 nanometers.

5. The integrated circuit according to claim 1, wherein the low voltage dielectric layer has a same composition and a same thickness as a gate dielectric layer of a low voltage transistor of the integrated circuit intended to operate at low voltages below 5V.

6. The integrated circuit according to claim 1, wherein the second conductive layer has a same composition and a same thickness as a gate conductive region of a low voltage transistor of the integrated circuit intended to operate at low voltages below 5V.

7. The integrated circuit according to claim 1, wherein the first conductive layer has a same composition and a same thickness as a gate conductive region of a high voltage transistor of the integrated circuit intended to operate at high voltages greater than 5V.

8. An integrated circuit including a capacitive element, comprising:
   a first conductive layer on an insulating substrate;
   a low voltage dielectric layer covering a top surface and edge of the first conductive layer and extending on a top surface of the insulating substrate;
   a second conductive layer covering the low voltage dielectric layer;
   wherein the second conductive layer includes an opening electrically separating the second conductive layer into a first portion located over a first part of the first conductive layer and a second portion located over a second part of the first conductive layer and over the insulating substrate outside the edge of the first conductive layer;
   wherein the first portion of the second conductive layer provides a first electrode of the capacitive element; and
   wherein the second portion of the second conductive layer is electrically connected to the first conductive layer to provide a second electrode of the capacitive element; and
   wherein the second portion of the second conductive layer annularly surrounds the first portion of the second conductive layer.

9. The integrated circuit according to claim 8, wherein the electrical connection of the second portion of the second conductive layer to the first conductive layer extends through the opening electrically separating the second conductive layer into the first and second portions.

10. The integrated circuit according to claim 8, wherein the insulating substrate is a shallow trench isolation formed in a substrate.

11. The integrated circuit according to claim 10, further comprising a transistor having a gate electrode insulated from the substrate by a gate oxide layer, and wherein the low voltage dielectric layer is made of a same material as the gate oxide layer.

12. The integrated circuit according to claim 10, further comprising a transistor having a gate electrode, and wherein the gate electrode and first conductive layer are made of a same material.

13. The integrated circuit according to claim 10, further comprising a transistor having a gate electrode, and wherein the gate electrode and second conductive layer are made of a same material.

14. The integrated circuit according to claim 8, wherein the second portion of the second conductive layer covers the edge of the first conductive layer.

15. The integrated circuit according to claim 8, wherein the low voltage dielectric layer is made of silicon oxide.

16. An integrated circuit including a capacitive element, comprising:
   a first conductive layer on an insulating substrate;
   a low voltage dielectric layer covering a top surface and edge of the first conductive layer and extending on a top surface of the insulating substrate;
   a second conductive layer covering the low voltage dielectric layer;
   wherein the second conductive layer includes an opening electrically separating the second conductive layer into a first portion located over a first part of the first conductive layer and a second portion located over a second part of the first conductive layer and over the insulating substrate outside the edge of the first conductive layer;

wherein the first portion of the second conductive layer provides a first electrode of the capacitive element; and wherein the second portion of the second conductive layer is electrically connected to the first conductive layer to provide a second electrode of the capacitive element; and wherein the electrical connection of the second portion of the second conductive layer to the first conductive layer extends through the opening electrically separating the second conductive layer into the first and second portions.

17. The integrated circuit according to claim 16, wherein the insulating substrate is a shallow trench isolation formed in a substrate.

18. The integrated circuit according to claim 17, further comprising a transistor having a gate electrode insulated from the substrate by a gate oxide layer, and wherein the low voltage dielectric layer is made of a same material as the gate oxide layer.

19. The integrated circuit according to claim 17, further comprising a transistor having a gate electrode, and wherein the gate electrode and first conductive layer are made of a same material.

20. The integrated circuit according to claim 17, further comprising a transistor having a gate electrode, and wherein the gate electrode and second conductive layer are made of a same material.

21. The integrated circuit according to claim 16, wherein the second portion of the second conductive layer covers the edge of the first conductive layer.

22. The integrated circuit according to claim 16, wherein the low voltage dielectric layer is made of silicon oxide.

* * * * *